United States Patent
Hsiao et al.

(10) Patent No.: US 6,617,264 B1
(45) Date of Patent: Sep. 9, 2003

(54) SOG MATERIALS FOR SPACER ANODIC BONDING AND METHOD OF PREPARING THE SAME

(75) Inventors: Ming-Chun Hsiao, Hsinchu (TW); Kai-Nung Su, Taipei (TW); Cheng-Chung Lee, Hsinchu (TW); Pang Lin, Hsinchu (TW); San-Yuan Chen, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 10/237,041

(22) Filed: Sep. 9, 2002

(30) Foreign Application Priority Data

Jun. 25, 2002 (TW) .......................... 91113890 A

(51) Int. Cl.$^7$ .......................... H01L 21/31; H01L 21/469
(52) U.S. Cl. .......................... 438/780; 438/778; 428/447
(58) Field of Search .......................... 438/778, 780; 428/447; 528/10, 34

(56) References Cited

U.S. PATENT DOCUMENTS

| | | | | | |
|---|---|---|---|---|---|
| 5,470,802 A | * | 11/1995 | Gnade et al. | ................ | 437/238 |
| 5,488,015 A | * | 1/1996 | Havemann et al. | ......... | 437/195 |
| 6,423,651 B1 | * | 7/2002 | Nakano et al. | ............ | 438/782 |
| 6,465,368 B2 | * | 10/2002 | Inoue et al. | ................ | 438/780 |
| 6,506,497 B1 | * | 1/2003 | Kennedy et al. | ............ | 428/447 |
| 2003/0008155 A1 | * | 1/2003 | Hayashi et al. | ............. | 428/447 |

* cited by examiner

Primary Examiner—Alexander Ghyka

(57) ABSTRACT

Disclosed herein is an SOG (Spin on Glass) material for spacer anodic bonding, which includes: 0.1~3 wt % of tetraethyl orthosilicate (TEOS); 0.1~5 wt % of methyl triethyl orthosilicate (MTEOS); 20~30 wt % of ethanol; 0.1~2 wt % of acetic acid solution containing alkali metal ions; and 0.1~10 wt % of water. The solid content of alkali metal elements in the acetic acid solution containing alkali metal ions is 5%~60%, and the pH value of the SOG material is 4~6.

12 Claims, No Drawings

SOG MATERIALS FOR SPACER ANODIC BONDING AND METHOD OF PREPARING THE SAME

This nonprovisional application claims priority under 35 U.S.C. §119(a) on Patent Application No. 91113890 filed in Taiwan on Jun. 25, 2002, which is herein incorporated by reference.

BACKGROUND OF THE INVENTION

1. Field of the Invention

This invention relates to a material for spacer bonding, particularly to an SOG (Spin on Glass) material for spacer anodic bonding, and to a method of preparing the same.

2. Description of the Prior Art

The technology of micromachining uses semiconductor processes to manufacture mechanical elements, such as minute cantilevers, thin sheets, gears, and valves. The size of these elements can be even smaller than one micrometer (one millionth meter). Therefore, micromachining can be used to manufacture motors having dimensions equal to the diameter of a strand of hair.

The technology of microelectromechanical system, or MEMS, has the advantages as follows:

(1) mechanical structures and electronic circuits can be integrated;
(2) the costs for manufacturing the products can be reduced and the quality can be maintained constantly by batch fabrication; and
(3) the size of products can be reduced while the precision is increased.

Therefore, MEMS technology can be used to manufacture many sensors and actuators at low cost. Currently, commercial products produced through the utilization of MEMS technology are, for example, pressure gages, accelerometers, biosensors, ink jet printer heads, a number of disposable medical instruments, and the like. In addition to its many present applications, MEMS technology may prove useful to the development of critical industries such as defense and biology. Thus, many advanced countries are investing heavily in this technology.

The technique of bonding to substrates is very important to MEMS. Recently, the bonding techniques have diversified, and among them, the application of anodic bonding in microsensor, elements, micromechanical elements or field emission display (FED) elements has produced remarkable results. Accordingly, developing new material for anodic bonding will undoubtedly become one of the most important research targets in this field.

SUMMARY OF THE INVENTION

In view of the above, the main object of the invention is to provide an SOG material for spacer anodic bonding in FED processes. The SOG material includes:

0.1~3 wt % of tetraethyl orthosilicate (TEOS);
0.1~5 wt % of methyl triethyl orthosilicate,(MTEOS);
20~30 wt % of ethanol;
0.1~2 wt % of acetic acid solution containing alkali metal ions; and
0.1~10 wt % of water; wherein
the solid content of alkali metal elements in the acetic acid solution containing alkali metal ions mentioned above is 5%–60% based on the weight of the acetic acid solution containing alkali metal ions, and the pH value of the SOG material is between about 4 and 6.

The bonding strength between spacer and substrate achieved by anodic bonding can be greatly increased with the solid content of alkali metal elements by the use of the SOG material for spacer anodic bonding of this invention.

Another object of the invention is to provide a method of preparing an SOG material for spacer anodic bonding, comprising the steps of:

(i) mixing 0.1~3 wt % of tetraethyl orthosilicate (TEOS), 0.1~5 wt % of methyl triethyl orthosilicate (MTEOS) and 20~30 wt % of ethanol to obtain a first mixture; and
(ii) mixing the first mixture and a mixture of 0.1~2 wt % of acetic acid solution containing alkali metal ions and 0.1~10 wt % of water to form the SOG material; wherein
the solid content of alkali metal elements in the acetic acid solution containing alkali metal ions is 5%~60% based on the weight of the acetic acid solution containing alkali metal ions, and the pH value of the SOG material is 4~6.

DETAILED DESCRIPTION OF THE INVENTION

The following example is intended to illustrate the invention more fully without limiting its scope, since numerous modifications and variations will be apparent to those skilled in this art.

EXAMPLE

The Preparation of SOG Solution

First, 1 wt % of tetramethyl orthosilicate (TEOS) and 1.5 wt % of methyl triethyl orthosilicate (MTEOS) were mixed, and 25 wt % of anhydrous ethanol was added. The three components were mixed uniformly to obtain the first mixture.

Second, a determined amount of lithium acetate hydrate ($CH_3COOLi.nH_2O$) powder was dissolved in deionized water, and, then, an amount of acetic acid was added to allow the ratio of the total amount by weight percent of acetic acid to the total amount by weight percent of water to be 0.4:6, based on 1 wt % TEOS mentioned above, to prepare a lithium ion-containing acetic acid solution with 38% of solid content of lithium. In this example, lithium acetate dihydrate powder ($CH_3COOLi.2H_2O$) was used as the lithium acetate hydrate powder mentioned above.

Subsequently, the lithium ion-containing acetic acid solution as above and the first mixture as above were mixed, and the SOG solution of this invention was formed. The pH value of the SOG solution as above measured with a pH meter is about 4~6. It is preferred that pH value is between 5 and 6.

Finally, the SOG solution obtained from the above was heated at the temperature of 50~60° C. to react for 3 hours. Then, it was placed in a refrigirator for storage.

Additionally, in this example, the amounts used for TEOS, MTEOS, and anhydrous ethanol mentioned above were 1 wt %, 1.5 wt %, and 25 wt %, respectively. But these amounts should not be construed as the limits for this invention. The amounts can be appropriately adjusted according to the desired practical application. The amount of TEOS is preferably 0.1~3 wt %. The amount of MTEOS is preferably 0.1~5 wt %. The amount of anhydrous ethanol is preferably 20~30 wt %. Also, the solid content of lithium in the acetic acid solution containing lithium ions mentioned above can be adjusted according to the desired practical application, but 5%~60% based on the weight of the acetic acid solution containing lithium ions is preferred. Additionally, although an acetic acid solution containing lithium ions was used in this example, an acetic acid solution containing other alkali metal ions, for example, acetic acid solution containing sodium ions or acetic acid solution containing potassium ions can be used.

Anodic Bonding of SOG

First, a piece of ITO glass (9 cm×3 cm) was provided. The ITO glass was placed in ethanol and washed with an ultrasonic cleaner for 5 minutes. Then, it was washed in DI water and dried with air spray. Subsequently the ITO glass was placed on a hot plate and heated at 110° C. to remove the residual of water on the surface. The resulting ITO glass was placed on a spin coater.

Next, an appropriate amount of the SOG solution was added on the ITO glass which had been treated as the above, and then the ITO glass was subjected to the spin coating at pre-rotational speed of 1000 rpm for 10 seconds and at final rotational speed of 2000 rpm for 30 seconds. After the spin coating, the resulting ITO glass was baked at 200° C. to remove water and solvent until the thickness of SOG film was 1.5 $\mu$m. Then it was placed in the furnace under oxygen for annealing at 500° C. for 2 hours.

Finally, the anodic bonding was conducted. It was found that a piece of glass with area of 1 mm$^2$ could be bonded to the substrate coated with the SOG material of this invention just within a period of about 10 minutes when the temperature of the substrate was from 300 to 350° C. and the electric field was 0.7 V/$\mu$m~1.1 V/$\mu$m.

In view of the above, the bonding strength between spacer and substrate can be improved greatly when anodic bonding is implemented with the SOG material of this invention mentioned above. The effect on improving the bonding strength between spacer and substrate can be efficiently achieved through the use of the SOG material of this invention, thus it is suitable for the application in, for example, the bonding between the spacers and the glass substrate in FED.

The foregoing description of the preferred embodiment of this invention has been presented for purposes of illustration and description. Obvious modifications or variations are possible in light of the above teaching. The embodiment was chosen and described to provide the best illustration of the principles of this invention and its practical application to thereby enable those skilled in the art to utilize the invention in various embodiments and with various modifications as are suited to the particular use contemplated. All such modifications and variations are within the scope of this invention as determined by the appended claims when interpreted in accordance with the breadth to which they are fairly, legally, and equitably entitled.

What is claimed is:

1. An SOG material for spacer anodic bonding, comprising:

0.1~3 wt % of tetraethyl orthosilicate (TEOS);
   0.1~5 wt % of methyl triethyl orthosilicate (MTEOS);
   20~30 wt % of ethanol;
   0.1~2 wt % of acetic acid solution containing alkali metal ions; and
   0.1~10 wt % of water; wherein
   the solid content of alkali metal elements in the acetic acid solution containing alkali metal ions is 5%~60% based on the weight of the acetic acid solution containing alkali metal ions, and the pH value of the SOG material is 4~6.

2. The SOG material for spacer anodic bonding as claimed in claim 1, wherein the alkali metal element is lithium, sodium, or potassium.

3. The SOG material for spacer anodic bonding as claimed in claim 1, wherein the acetic acid solution containing alkali metal ions is formed by dissolving the lithium acetate hydrate (CH$_3$COOLi.nH$_2$O) in the water.

4. The SOG material for spacer anodic bonding as claimed in claim 3, wherein n is 2.

5. The SOG material for spacer anodic bonding as claimed in claim 1, wherein the water is deionized water.

6. The SOG material for spacer anodic bonding as claimed in claim 1, wherein the pH value of the SOG material is 5~6.

7. A method of preparing an SOG material for spacer anodic bonding, comprising the steps of:

(i) mixing 0.1~3 wt % of tetraethyl orthosilicate (TEOS), 0.1~5 wt % of methyl triethyl orthosilicate (MTEOS) and 20~30 wt % of ethanol to obtain a first mixture; and (ii) mixing the first mixture and a mixture of 0.1~2 wt % of acetic acid solution containing alkali metal ions and 0.1~10 wt % of water to form the SOG material; wherein
   the solid content of alkali metal elements in the acetic acid solution containing alkali metal ions is 5%~60% based on the weight of the acetic acid solution containing alkali metal ions, and the pH value of the SOG material is 4~6.

8. The method as claimed in claim 7, wherein the alkali metal element is lithium, sodium, or potassium.

9. The method as claimed in claim 7, wherein the acetic acid solution containing alkali metal ions is formed by dissolving the lithium acetate hydrate (CH$_3$COOLi.nH$_2$O) in the water.

10. The method as claimed in claim 9, wherein n is 2.

11. The method as claimed in claim 7, wherein the water is deionized water.

12. The method as claimed in claim 7, wherein the pH value of the SOG material is 5~6.

* * * * *